(12) United States Patent
Yonetake et al.

(10) Patent No.: US 7,183,697 B2
(45) Date of Patent: Feb. 27, 2007

(54) ACTUATOR

(75) Inventors: Naoto Yonetake, Sendai (JP); Toru Ueno, Sendai (JP); Kazuhiro Kobayashi, Fujiyoshida (JP); Keita Watanabe, Fujiyoshida (JP); Naoki Miura, Fujiyoshida (JP); Yoshiro Ohkawa, Kawasaki (JP); Harunami Suzuki, Kawasaki (JP)

(73) Assignees: Citizen Electronics Co., Ltd., Yamanashi (JP); NEC Tokin Corporation, Miyagi (JP); Authentic, Ltd., Kanagawa (JP)

( * ) Notice: Subject to any disclaimer, the term of this patent is extended or adjusted under 35 U.S.C. 154(b) by 23 days.

(21) Appl. No.: 10/972,757

(22) Filed: Oct. 26, 2004

(65) Prior Publication Data

US 2005/0116585 A1 Jun. 2, 2005

(30) Foreign Application Priority Data

Oct. 27, 2003 (JP) ............................ P2003-365507
Sep. 10, 2004 (JP) ............................ P2004-263399

(51) Int. Cl.
*H01L 41/08* (2006.01)

(52) U.S. Cl. ................ 310/330; 310/331; 310/344; 310/348

(58) Field of Classification Search ............... 310/328, 310/330–332, 339, 348, 344
See application file for complete search history.

(56) References Cited

U.S. PATENT DOCUMENTS 4,333,029 A * 6/1982 Kolm et al. ............... 310/329
4,492,360 A * 1/1985 Lee et al. .............. 251/129.06
4,625,137 A 11/1986 Tomono
6,222,304 B1 * 4/2001 Bernstein ..................... 310/328
2003/0168943 A1 9/2003 Matsuyama et al.

FOREIGN PATENT DOCUMENTS

| EP | 1501074 A2 | 1/2005 |
| JP | 63-117671 | 5/1988 |
| JP | 02-246383 | 10/1990 |
| JP | 09-327655 A | 12/1997 |
| WO | WO 01/54450 A2 | 7/2001 |
| WO | WO 2004/077497 A2 | 9/2004 |

* cited by examiner

Primary Examiner—Mark Budd
(74) Attorney, Agent, or Firm—Browdy and Neimark, PLLC

(57) ABSTRACT

An actuator, comprising a beam (2) including a laminated structure which has piezoelectric layers (30, 31, 32) and electrode layers (20, 21, 22, 23), a holding mechanism to hold the beam, a feeding terminal (10) to supply an exciting power to the electrode layers of the beam, and a contact mechanism provided in the holding mechanism, the holding mechanism comprising a case (1) including a space (5) to house the beam (2) and a holding part to hold at least one of an end and a central portion of the beam (2), the contact mechanism being configured to contact with a part of the beam (2) and prevent the beam from excessively deflecting when a great impact is added to the beam.

12 Claims, 6 Drawing Sheets

ACTUATOR

CROSS-REFERENCE TO THE RELATED APPLICATION

The application claims the priority benefit of Japanese Patent Applications No. 2003-365507, filed on Oct. 27, 2003, and No. 2004-263399, filed on Sep. 10, 2004, the entire descriptions of which are incorporated herein by reference.

BACKGROUND OF THE INVENTION

1. Field of the Invention

The present invention relates to an actuator used for a compact terminal device such as a mobile phone or the like.

2. Description of Related Art

Conventionally, an actuator of a bimorph or mono-morph type and so on has been developed. For example, there has been known an actuator of a mono-morph-type, which includes a holder and a beam whose central portion is adhesively fixed on the holder. The beam has a metallic plate referred to as a shim and piezoelectric layers formed on one surface of the shim. An alternating-current-signal voltage is applied to the piezoelectric layers in a direction of thickness thereof so as to expand and contract in a longitudinal direction of the piezoelectric layers, thereby flexural oscillation is excited to the beam.

There has been also known an actuator of a bimorph-type in which piezoelectric layers are formed on opposite surfaces of a metallic body.

There has been also known an actuator of a bimorph-type configured to hold by a hairpin-like resilient holding member a beam in which a plurality of laminated structures having piezoelectric and electrode layers are formed on opposite surfaces of a shim.

In these actuators, by adopting a structure in which homo-polar upper and lower electrode layers are connected with electrode layers extending along end surfaces of the piezoelectric layers, a wiring mechanism between the plurality of electrode layers and signal inputting terminals is simplified to intend reduction of a production cost and improvement in reliability due to the simplification of structure.

On the other hand, a user often drops accidentally a compact mobile instrument such as a mobile phone against a floor, for example. In this case, it is necessary to give a sufficient strength to the compact mobile instrument so that it is not broken.

If each of the above-mentioned actuators is installed in a mobile phone as a speaker, when dropping freely the mobile phone from a height of about 1.5 m against a concrete floor, it is necessary to have a sufficient strength so that the beam is not broken to the actuator for flexural oscillation of an excess amplitude generated in the beam by impact of the drop.

However, there is a problem that the beam is easy to be broken because the piezoelectric layers are made of brittle ceramic and the beam has an elongate shape and so on, in the above-mentioned flexural-oscillation-type actuator of the mono-morph or bimorph-type.

On the other hand, in the conventional bimorph-type actuator having the laminated structures formed on the both surfaces of the metallic body, there are problems that one or more sags which are unnecessary extending portions are formed on electrode layers extending along end surfaces of the piezoelectric layers in order to connect upper and lower homo-polar electrode layers, and the sags contact with the shim to generate a short circuit accident. To prevent the short circuit accident, a material for the shim must be changed to a resin or the like. This results in narrow flexibility for selecting the material.

SUMMARY OF THE INVENTION

Therefore, an object of the present invention is to provide an actuator having a structure difficult to be broken by an impact strength applied from exterior.

Another object of the present invention is to provide an actuator of a multi-laminated type having a structure difficult to generate a short-circuit accident between electrode layers even if a metallic shim is used.

To accomplish the objects, an actuator in an aspect of the present invention comprises a beam including an oscillating part, a holding mechanism including a space to house the beam and a holding part to hold the beam, a feeding terminal to supply an exciting power to the beam, and a contact mechanism provided in the holding mechanism and configured to prevent the oscillating part of the beam from excessively deflecting when a great impact is applied to the beam.

The beam includes a plated body and a laminated structure formed on at least one surface of the plated body. The laminated structure has piezoelectric layers and electrode layers, which are laminated with respect to each other.

The contact mechanism has a limiting structure provided in the holding mechanism to be contactable with at least one part of the beam.

The limiting structure limits a movement of the beam in a direction of thickness thereof.

A plurality of piezoelectric layers and a plurality of electrode layers are laminated in a thickness direction of the laminated structure, some electrode layers being connected with respect to each other at a notch which is formed on an end of the plated body at ends of the piezoelectric layers and has a width less than that of the plated body.

DETAILED DESCRIPTION OF THE PREFERRED EMBODIMENTS

Several preferred embodiments of the present invention will be described in detail with reference to the accompanying drawings below.

Figure 1:
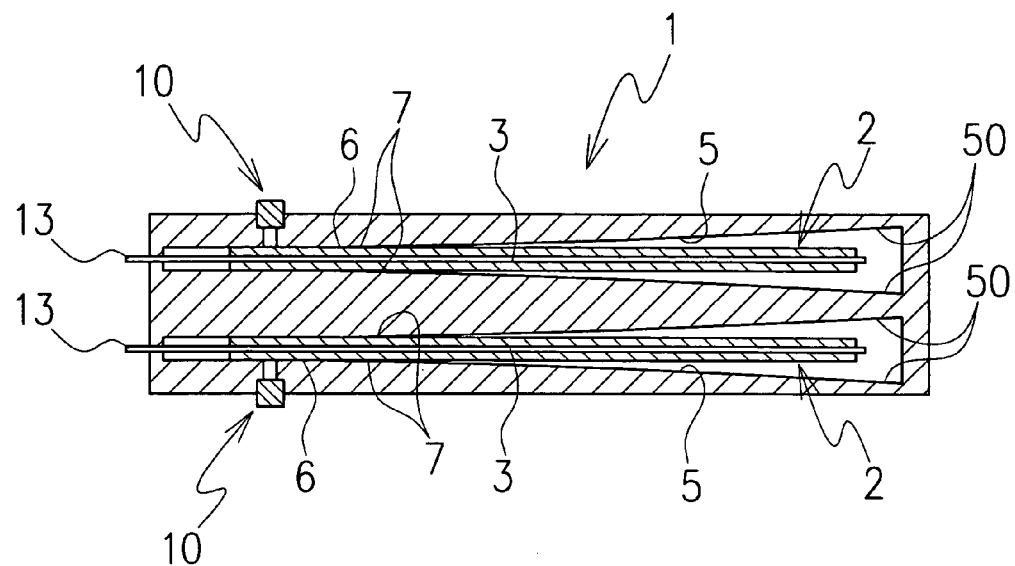
FIG. 1 is a sectional view showing a structure of an actuator in one embodiment of the present invention.

FIG. 1 illustrates a structure of an actuator in one embodiment of the present invention. The actuator comprises a holding mechanism, for example, a case 1 and a beam 2 attached within the case 1, as shown in FIG. 1. The case 1 is made of an electrical-insulative resin, whose outer shape has a cuboid, in the embodiment. A plurality of beams 2, for example, two beams 2 and 2 are provided in the embodiment (see FIG. 3). Each of the beams 2 and 2 is structured from an elongate rectangular member.

Figure 2:
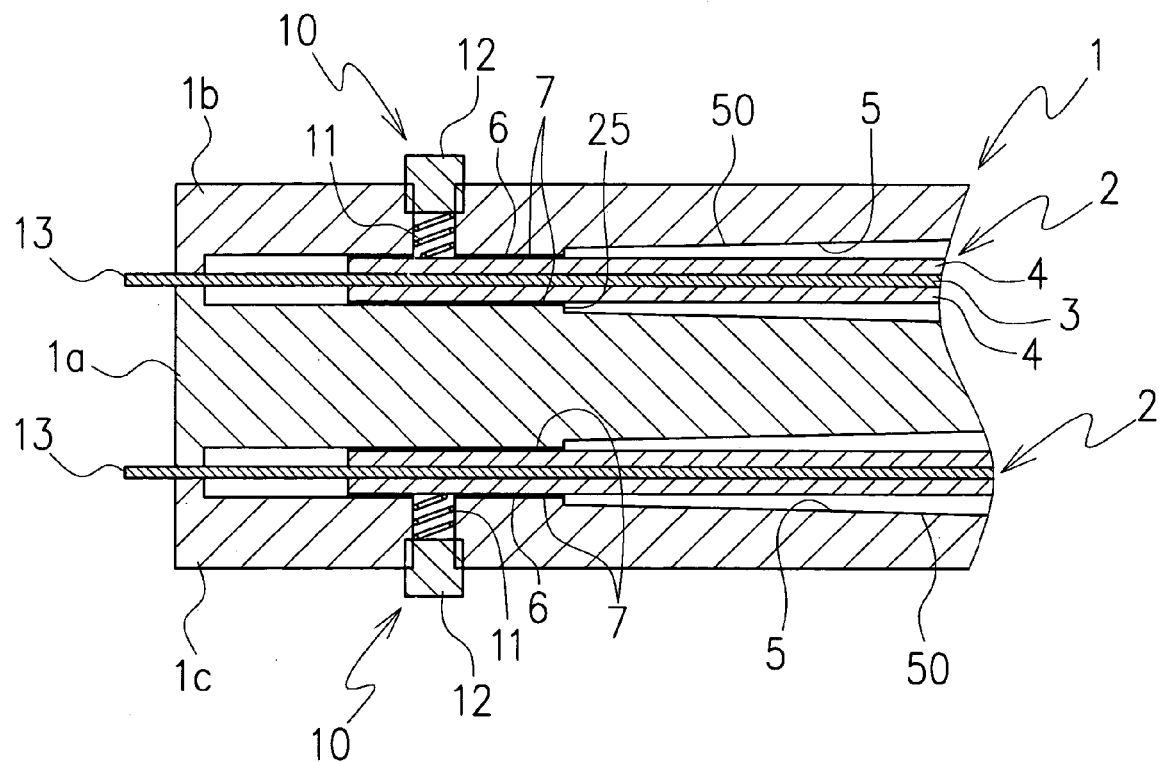
FIG. 2 is a partially exploded sectional view showing exploding only a holding part shown in FIG. 1.
Figure 4:
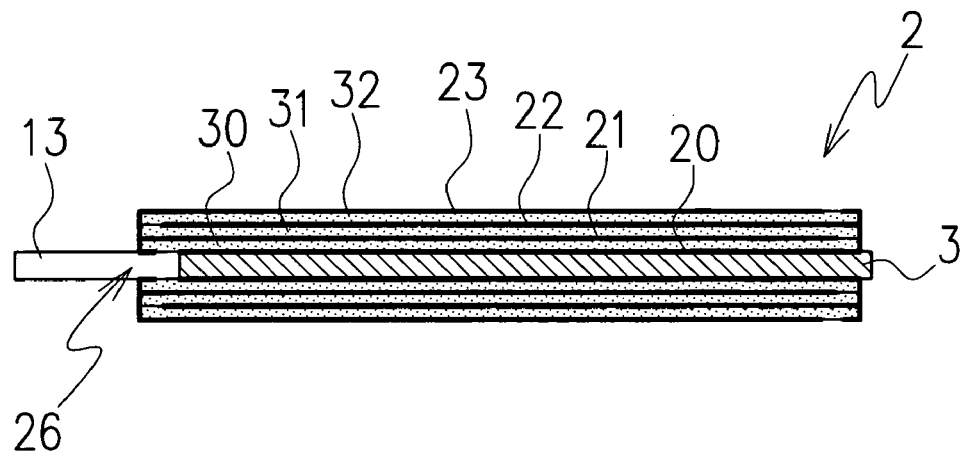
FIG. 4 is a sectional view taken along A—A line in FIG. 1.

Each of the beams 2 and 2 includes a plated body 3 and a laminated structure 4 including piezoelectric layers and electrode layers formed on at least one surface of the plated body 3. In the embodiment, the laminated structures 4 are provided on opposite surfaces of the plated body 3, for example, front-back both surfaces thereof, as shown in FIGS. 1, 2 and 4.

The case 1 has spaces 5 and 5 extending in a longitudinal direction of the case 1, disposed to space with respect to each other, and configured to contain the beams 2 and 2.

An end, for example, a left end of each of the beams 2 and 2 is inserted into a holding part 6 formed in each of the spaces 5 and 5 and fixed to the holding part 6 by an adhesive layer 7. In addition, fixation of the beam 2 to the holding part 6 can be executed by an adhesive tape, press-fitting of the beam 2 in the holding part 6, or pressure bonding of the opposite surfaces of the beam 2 against the holding part 6, other than the adhesive layer 7. Consequently, each beam 2 forms a cantilever in such a manner that one end of the beam 2 is fixed to the case 1 and the other end of the beam 2 is free.

The case 1 has an intermediate portion 1a, an upper portion 1b disposed to sandwich one beam 2 between the intermediate and upper portions 1a and 1b, and a lower portion 1c disposed to sandwich the another beam 2 between the intermediate and lower portions 1a and 1c, the upper, intermediate and lower portions 1b, 1a and 1c are fastened by bolts inserted into not-illustrated through-holes provided in these portions and nuts in which the bolts are threaded after the upper, intermediate and lower portions are stacked sequentially while sandwiching the beams 2 and 2 therebetween.

On the case 1 feeding terminals 10 for the beams 2 and 2 are provided, which have coil springs 11 whose leading ends are disposed to contact with the laminated structures through the case 1 made of the electric-insulative resin and the adhesive layers 6 and 6 (see FIG. 2). Reference numeral 12 denotes caps attached to the case 1 so as to support the coil springs 11.

Next, a structure of each beam 2 is explained in further detail with reference to FIGS. 3 and 4.

The plated body 3 comprises a shim made of a metallic plate such as stainless steel in the embodiment. Each of laminated structures 4 including electrode layers and piezoelectric layers, which are formed on opposite surfaces of the shim 3 has an earth electrode layer 20, a first piezoelectric layer 30 laminated on the earth electrode layer 20, a first electrode layer 21 laminated on the first piezoelectric layer 30, a second piezoelectric layer 31 laminated on the first electrode layer 21, a second electrode layer 22 laminated on the second piezoelectric layer 31, a third piezoelectric layer 32 laminated on the second electrode layer 22 and a third electrode layer 23 laminated on the third piezoelectric layer 32. The third electrode layer 23 forms the uppermost electrode layer of the beam 2.

Moreover, a left end of each shim 3 forms an earth terminal 13 by projecting outwardly from a left end of the case 1 made of the resin. An earth electric-potential is supplied from the earth terminal 13 (see FIGS. 1 to 4) through the shim 3 to the earth electrode layer 20 contacting with a surface of the shim 3.

The earth electrode layer 20 is connected with the first electrode layer 21 through metallic layers formed on end surfaces of the first and second piezoelectric layers 30 and 31. Similarly, the uppermost electrode layer 23 connected with the feeding terminal 10 (FIGS. 1 and 2) is connected with the second electrode layer 22 through metallic layers formed on end surfaces of the second and third piezoelectric layers 31 and 32.

To the first piezoelectric layer 30, an earth electric-potential is supplied at its lower portion or side adjacent to the shim 3, and a signal voltage is supplied at its upper portion or side remote from the shim 3. Similarly, to the third piezoelectric layer 32, an earth electric-potential is supplied at its lower portion, and a signal voltage is supplied at its upper portion. Reversely, to the second piezoelectric layer 31, a signal voltage is supplied at its lower portion, and an earth electric-potential is supplied at its upper portion. In addition, polarity of electric-distortion turning upside down with respect to the first and third piezoelectric layers 30 and 32 is previously given to the second piezoelectric layer 31.

As a result, the first, second and third piezoelectric layers 30, 31 and 32 in each laminated structure expand and contract to reinforce in the same direction with respect to each other by a signal voltage applied to the feeding terminal. In this way, by the structure that the plurality of electrode layers having the same polarity are connected with respect to each other at the ends of the plurality of laminated piezoelectric layers, it is possible to expand and contract the plurality of piezoelectric layers in each beam in the same direction through the pair of feeding and earth terminals, hence a structure for supplying the signal voltage is significantly simplified and reliability is vastly improved. In this way, the free end, in other words, the oscillating part of each of the beams 2 and 2 is oscillated when the signal voltage is supplied from the feeding terminals to the laminated structures.

In addition, the actuator as described above is structured to install in a mobile phone or the like as a speaker, in the embodiment. However, it should be noted that the actuator is used for various instruments without being limited to the above-mentioned embodiment.

When a large impact is applied to the beams 2 and 2, a contact mechanism for preventing an excess deflection of the beams is provided in the case 1.

The contact mechanism includes a limiting structure provided in the case 1 to be contactable with at least one portion of each of the beams 2 and 2.

The limiting structure limits a movement of the beam in a thickness direction of the beam in one example. The limiting structure limits movement of the beam in a width direction of the beam in another example.

In an embodiment, the contact mechanism includes at least one of curved surface portions 50 in which inner surfaces of the spaces 5 opposing to the beams 2 become large gradually as directing from the holding parts for holding the beams to the right end of the case 1, in other words, inner walls of each space 5 are formed smoothly so as to separate gradually from outer surfaces of the beams (see FIGS. 1 and 2). The curved surface portions 50 are forming inner surfaces which oppose to surfaces of the beam 2, namely, both front-back surfaces of the beam are opposed to each of the corresponding curved surfaces. Accordingly, an excess movement of the beams 2 and 2 is limited by the curved surface portions 50. The contact mechanism may include the taper surface portions instead of the curved surface portions 50.

Sizes of the curved surface portions 50 are set so that at least one portion of the front-back surfaces and/or the side surfaces of each beam 2 is abutted with the curved surface portions 50 of each space 5 at one place or a plurality of places in a longitudinal direction, or in a width direction of the beam 2, or at random when excess deflection occurs in each beam 2 for a great impact strength applied from the exterior. Such great impact strength occurs when the actuator itself or a terminal device such as a mobile phone in which the actuator is installed is dropped against a floor surface, and so on.

A deformed amount based on deflection of each beam is similar to a deformed amount pursuant to natural oscillation generated when uniformly distributed load by empty weight is applied to a cantilever rather than a deformed amount pursuant to usual flexural oscillation generated by supplying an electrical signal to the laminated structure including the piezoelectric and electrode layers. However, in this case, many times empty and gravity acceleration are set in accordance with a magnitude of impact strength. It is not necessary to form accurately a shape of each curved surface 50 formed on the inner walls of each space in the case 1 in such a manner as to contact completely with a surface of the beam throughout a full length thereof, the curved surface may be set so that the surface of the beam is contacted with the curved surface at one place or a plurality of places. The more contacting locations result in more dispersion of impact when the beam contacts with the curved surface, hence the destruction at the contacting positions is difficult to generate.

A step 25 is formed on each inner wall of the space 5 between each holding part 6 and each inner surface of the space 5 in each beam 2 (see FIG. 2). The step 25 is set to space with a value less than about 100 microns from the outer surface of the beam 2, which is in a resting and parallel state.

The size of the step 25 is set to the value of about 80 microns in the embodiment. By forming the step in this way, the beam 2 contact with an inner wall surface of the step 25 when the flexural oscillation of the beam is executed as always by the electrical signal supplied from feeding terminal 10, therefore it is possible to avoid a problem that sound quality is deteriorated.

Figure 3:
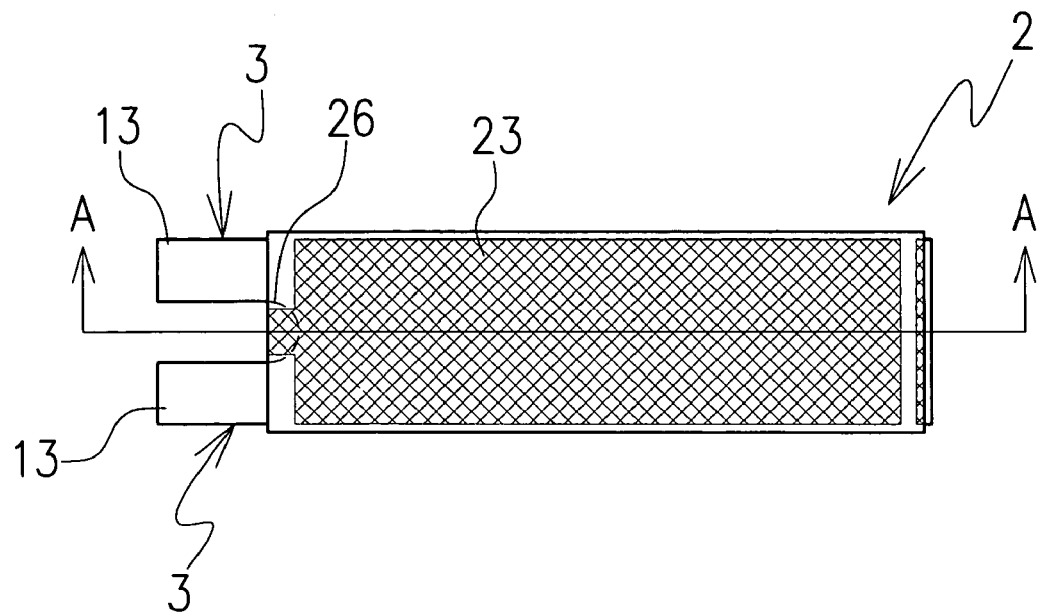
FIG. 3 is a plan view showing a structure of a beam shown in FIG. 1.

Referring to FIGS. 3 and 4, a semi-circular notch 26 is formed in the shim 3 at an end portion of the beam 2 beside the holding parts of the laminated structures 4. The notch 26 is formed as a mechanism for avoiding that one or more sags of the electrode layers extending on end surfaces of the piezoelectric layers contact with the adjacent reverse polar electrode layers, and short circuit accident occurs. The sag is formed as an unnecessarily extended portion when the electrode layers extend along the end surfaces of the piezoelectric layers in order to contact the upper and lower homo-polar electrode layers.

In an example shown in FIG. 4, there is generated an unnecessary sag extending to an end surface and a bottom surface of the first piezoelectric layers 30 on the metallic layer formed by application or the like of a conductive material on the end surfaces of the second and third piezoelectric layers 31 and 32 in order to connect the uppermost electrode layer 23 and the first electrode layer 21. Under such circumstances, if the notch 26 is not provided, the sag portion contacts with a surface of the shim 3 held in an earth potential and is in a short circuit state. By forming the notch 26 in this way, it is possible to avoid efficiently the generation of the short circuit accident.

Figure 5:
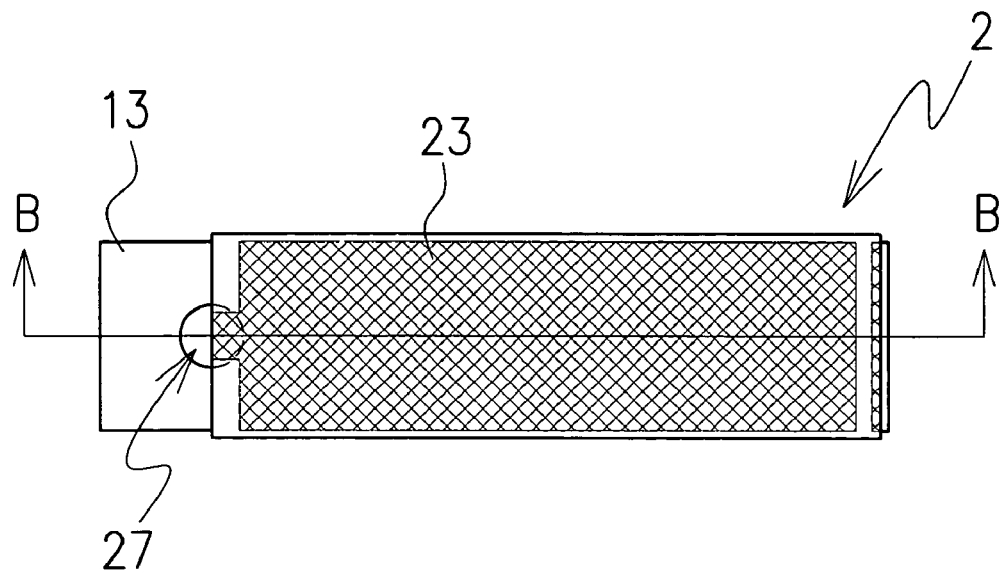
FIG. 5 is a plan view showing a beam in another embodiment of the present invention.
Figure 6:
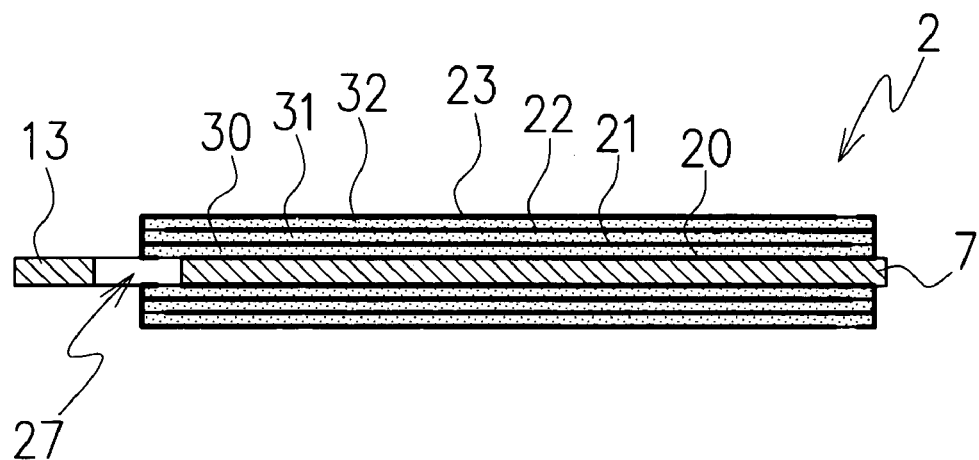
FIG. 6 is a sectional view taken along B—B line in FIG. 5.

FIGS. 5 and 6 illustrate a structure in another embodiment of the beam according to the present invention.

In the embodiment, a circular opening 27 is formed on an end portion of the beam 2 beside the holding part 6 in place of the notch 26 shown in FIGS. 3 and 4. Because the embodiment is the same as the embodiment shown in FIGS. 3 and 4 in the other points, the overlapped description is omitted.

Figure 7:
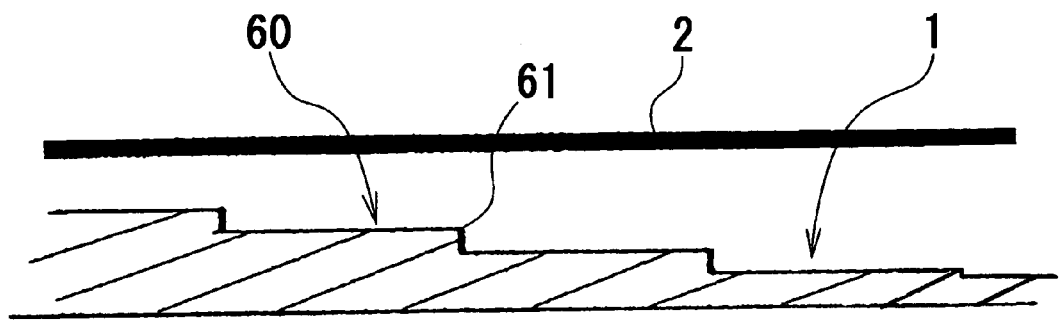
FIG. 7 is a partial sectional view showing a structure in another embodiment of a contact mechanism.

FIG. 7 illustrates a structure in yet another embodiment of the contact mechanism.

In the embodiment, the actuator has taper surfaces formed on the inner surfaces of the space 5 in the case 1 opposing to each beam 2, namely, inner surfaces of the space 5 opposing to the front-back both surfaces or the side surfaces of the beam 2, and the inner surfaces of the space 5 comprises a plurality of protrusions or steps 60 formed on at least one of the curved or taper surfaces and spaced in the longitudinal direction of the beam 2. If an excess deflection occurs in the beam 2 by great impact strength applied to the beam 2 when an instrument in which the actuator is installed is dropped, the beam 2 contacts with any of corners 61 of the plurality of protrusions or steps 60. Consequently, the excess deflection of the beam 2 is blocked and the destruction of the beam 2 is prevented.

Figure 8:
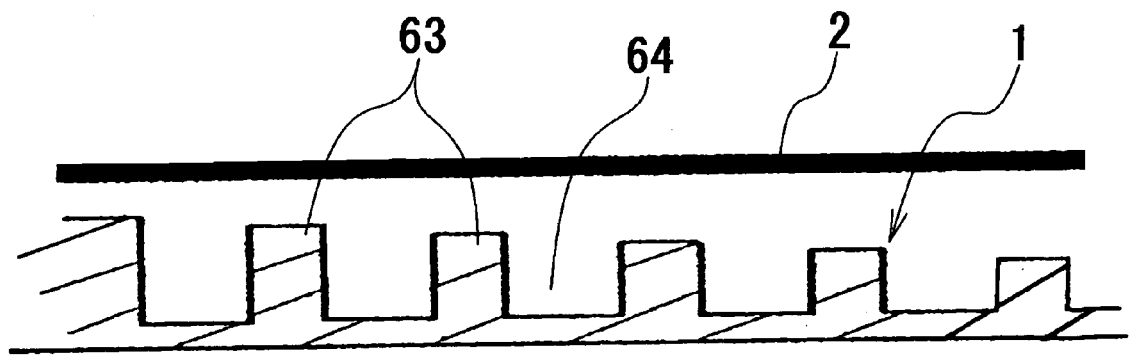
FIG. 8 is a partial sectional view showing a structure in yet another embodiment of a contact mechanism.

FIG. 8 illustrates a structure in further another embodiment of the contact mechanism.

In the embodiment, the actuator has at least one curved or taper surfaces formed on the inner surfaces of the space 5 in the case 1 opposing to the front-back surfaces or the side surfaces of each beam 2, a plurality of rectangular protrusions 63 formed on at least one of the curved or taper surfaces and disposed to space each other in a longitudinal direction, in a width direction, or at random of the beam 2 and a plurality of rectangular grooves 64 formed to extend in a width direction of the beam 2 between the plurality of protrusions. If the excess deflection occurs in the beam 2 by the great impact strength applied to the beam 2 when the instrument in which the actuator is installed is dropped, the beam 2 contacts with any of the plurality of protrusions 63. Consequently, the excess deflection of the beam 2 is blocked and the destruction of the beam 2 is prevented.

Figure 9:
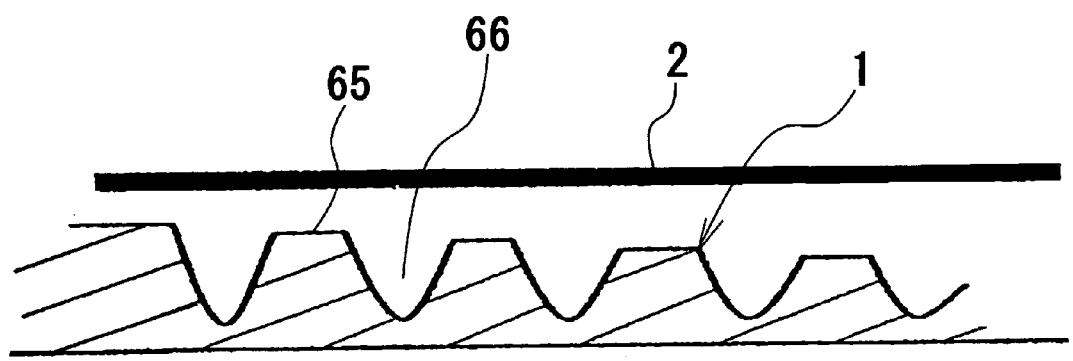
FIG. 9 is a partial sectional view showing a structure in yet another embodiment of a contact mechanism.

FIG. 9 illustrates a structure in yet another embodiment of the contact mechanism.

In the embodiment, the actuator has taper surfaces formed on the inner surfaces of the space 5 in the case opposing to the front-back surfaces or the side surfaces of each beam 2, a plurality of trapezoidal protrusions 65 formed on at least one of the taper surfaces and spaced in the longitudinal direction of the beam 2 and a plurality of V-character shaped grooves 66 formed to extend in the width direction of the beam 2 between the grooves 66. If the excess deflection occurs in the beam 2 by the great impact strength applied to the beam 2 when the instrument in which the actuator is installed is dropped, the beam 2 contacts with any of the protrusions 65. Consequently, the excess deflection of the beam 2 is restricted and the destruction of the beam 2 is prevented.

Figure 10:
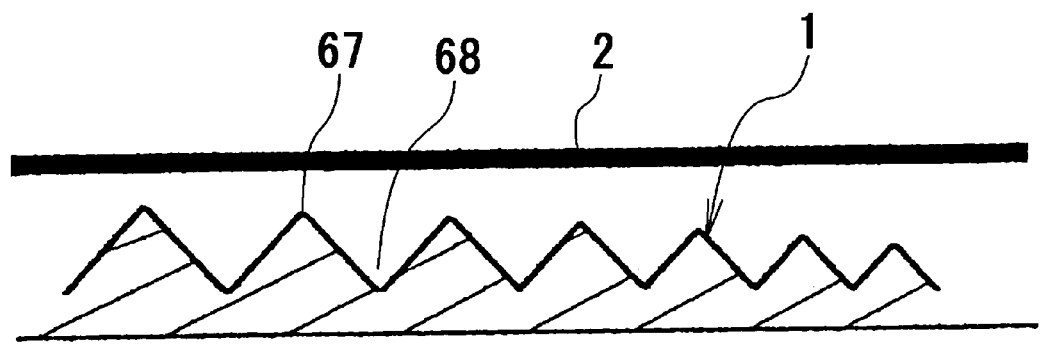
FIG. 10 is a partial sectional view showing a structure in yet another embodiment of a contact mechanism.

FIG. 10 illustrates a structure in yet another embodiment of the contact mechanism.

In the embodiment, the actuator has at least one of taper surfaces which comprise a plurality of triangular mountains 67 and valleys 68 and forming the space 5 in the case 1 opposing to the front-back surfaces or the side surfaces of each beam 2, and the plurality of triangular mountains 67 and valleys 68 form at least one of the taper surfaces and spaced in the longitudinal direction of the beam 2. If the excess deflection occurs in the beam 2 by the great impact strength applied to the beam 2 when the instrument in which the actuator is installed is dropped, the beam 2 contacts with any of edges of the plurality of mountains 67. Consequently, the excess deflection of the beam 2 is blocked and the destruction of the beam 2 is prevented.

Figure 11:
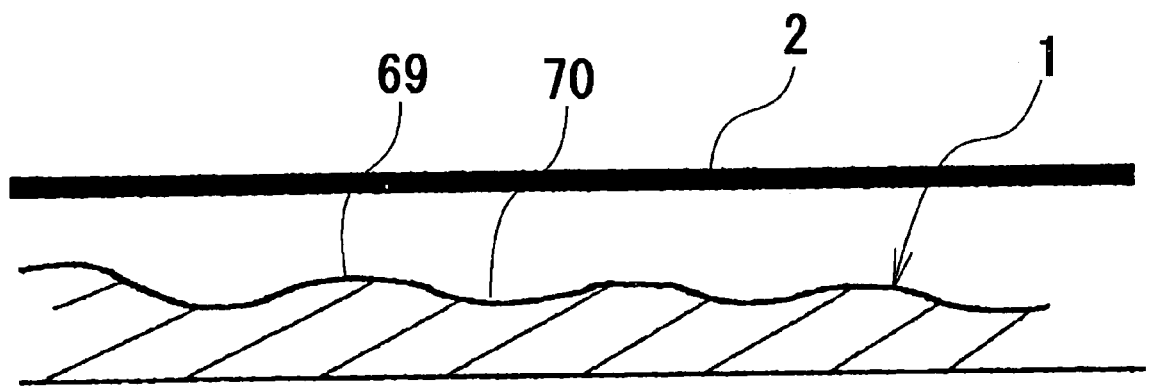
FIG. 11 is a partial sectional view showing a structure in yet another embodiment of a contact mechanism.

FIG. 11 illustrates a structure in yet another embodiment of the contact mechanism.

In the embodiment, the actuator has taper surfaces formed on the inner surfaces of the space 5 in the case opposing to the front-back both surfaces or the side surfaces of the beam 2 and a plurality of gently sloping mountains 69 and valleys 70 forming at least one of the taper surfaces and spacing in a longitudinal direction, in a width direction of the beam 2, or at random. If the excess deflection occurs in the beam 2 by the great impact strength applied to the beam 2 when the instrument in which the actuator is installed is dropped, the beam 2 contacts with any of edges of the plurality of mountains 69. Consequently, the excess deflection of the beam 2 is blocked and the destruction of the beam 2 is prevented.

In the above, the cases that the beams and the case contact in a line or surface at one place or a plurality of places are shown by way of example. However, it is also possible to structure so that a many of bar-like members each of which having a suitable height and a sharp leading portion are provided in a flat inner surface of the case, therefore a point contact state is formed between the curved beam and the each bar-like member.

Moreover, the case structuring the shim of the beam by the metallic plate is exemplified. However, it is also possible to use the other materials such as a CFRP (Carbon Fiber reinforced Plastic) as a material for the shim.

The two beams 2 and 2 are also exemplified. However, one or three beams may be used.

The cantilever structure holding the one end of the beam 2 is exemplified. However, the present invention may be applied to a structure holding a central part of the beam in a longitudinal direction of the beam.

Furthermore, the structure for carrying out the fixation of the beam to the holding part by adhesion is exemplified. However, it is also possible to adopt the other appropriate holding method such as to hold the beam to the holding part by an adhesive tape in place of the adhesion, to press-fit the beam in the holding part, to pressure-bond and hold the front-back both surfaces of the beam interposed between the upper and intermediate portions 1b and 1a, and the intermediate and lower portions 1a and 1c by fastening them upwardly and downwardly by the bolts and the nuts.

In addition, the case that the actuator is installed in the mobile phone or the like as a speaker is exemplified, but it may be used as a speaker for an appropriate electronic instrument such as the other appropriate mobile terminal device, a laptop computer or display.

According to the actuator, first, because the entire beam is contained in the case, it is avoided that one portion of the beam such as the leading end portion thereof clashes directly with the other adjacent parts and so on and damages for an excess deflection generated to the beam by impact strength applied to the beam from exterior.

Secondary, the deformed amount by the excess deflection of the beam generated by the impact strength applied from the exterior is limited by contacting the surface of the beam with the inner surfaces of the case. Because the contacting places of the surface of the beam and the inner surfaces of the case are distributed at a plurality of positions such as in a longitudinal direction, or in a width direction of the beam, or at random, the impact strength when contacting them is distributed at the plurality of contacting places, the damage generating when the impact strength is concentrated at one contacting place is avoided efficiently.

Although the preferred embodiments of the present invention have been described, the present invention is not limited to the embodiments. Various modifications and changes can be made for these embodiments.

What is claimed is:

1. An actuator, comprising:
    at least one beam including an oscillating part;
    a case including at least one space in which the beam is housed and at least one holding part to fix one end of the beam in the case;
    at least one feeding terminal to supply an exciting power to the beam;
    a limiting structure formed on at least one inner surface of the case which defines the space and is configured to contact the oscillating part of the beam and prevent excess deflection of the oscillating part; and
    wherein the inner surface is curved or tapered so that the space formed by the curved or tapered inner surface gradually increases with distance from the holding part of the beam in a longitudinal direction of the beam.

2. The actuator according to claim 1, wherein the beam includes a plated body and a laminated structure formed on at least one surface of the plated body, the laminated structure having piezoelectric layers and electrode layers, which are laminated with respect to each other.

3. The actuator according to claim 1, wherein the holding part holds the end or the center portion of the beam, and the oscillating part is formed on at least one free end portion of the beam.

4. The actuator according to claim 1, wherein the limiting structure limits a movement of the beam in a thickness direction of the beam.

5. The actuator according to claim 1, wherein the curved or tapered inner surface of the case includes a plurality of protrusions.

6. The actuator according to claim 5, wherein the plurality of protrusions are disposed at intervals in a longitudinal direction of the beam.

7. The actuator according to claim 5, wherein the plurality of protrusions are disposed at intervals in a width direction of the beam.

8. The actuator according to claim 5, wherein the plurality of protrusions are disposed at random.

9. The actuator according to claim 1, wherein a 100-micron or less step which defines an end of the holding part is formed between the holding part and the inner surface of the case.

10. The actuator according to claim 1, comprising a plurality of beams, the case having wall surfaces with a plurality of spaces to house each beam, and the limiting structure being formed on the wall surfaces opposite each beam.

11. The actuator according to claim 2, wherein a plurality of piezoelectric layers and a plurality of electrode layers are laminated in a thickness direction of the laminated structure, some electrode layers being connected to each other at a notch which is formed on an end of the plated body at ends of the piezoelectric layers and has a width less than that of the plated body.

12. The actuator according to claim 2, wherein a plurality of piezoelectric layers and a plurality of electrode layers are laminated in a thickness direction of the laminated structure, some electrodes being connected to each other at an opening which is formed on a central portion of the plated body at ends of the piezoelectric layers and has a diameter less than a width of the plated body.

* * * * *